United States Patent
Yoo et al.

(10) Patent No.: US 9,803,112 B2
(45) Date of Patent: Oct. 31, 2017

(54) PRESSURE SENSITIVE ADHESIVE FILM AND METHOD OF MANUFACTURING ORGANIC ELECTRONIC DEVICE USING THE SAME

(71) Applicant: LG CHEM, LTD., Seoul (KR)

(72) Inventors: Hyun Jee Yoo, Daejeon (KR); Suk Ky Chang, Daejeon (KR); Yoon Gyung Cho, Daejeon (KR); Kyung Yul Bae, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/763,410

(22) PCT Filed: Aug. 5, 2014

(86) PCT No.: PCT/KR2014/007235
§ 371 (c)(1),
(2) Date: Jul. 24, 2015

(87) PCT Pub. No.: WO2015/020407
PCT Pub. Date: Feb. 12, 2015

(65) Prior Publication Data
US 2016/0137887 A1    May 19, 2016

(30) Foreign Application Priority Data

Aug. 5, 2013 (KR) .......... 10-2013-0092782
Apr. 4, 2014 (KR) .......... 10-2014-0040817

(51) Int. Cl.
*H01L 29/08* (2006.01)
*C09J 109/00* (2006.01)
(Continued)

(52) U.S. Cl.
CPC .......... *C09J 109/00* (2013.01); *C09J 4/00* (2013.01); *C09J 7/00* (2013.01); *C09J 7/02* (2013.01);
(Continued)

(58) Field of Classification Search
CPC ...................................... C09J 109/00
USPC ........................................ 257/40
See application file for complete search history.

(56) References Cited

U.S. PATENT DOCUMENTS

2006/0121273 A1* 6/2006 Toyama .............. C08G 18/289
                                                        428/343
2009/0026934 A1* 1/2009 Fujita ...................... C09J 7/021
                                                        313/504
(Continued)

FOREIGN PATENT DOCUMENTS

CN    1872933 A    12/2006
CN  101151343 A     3/2008
(Continued)

OTHER PUBLICATIONS

Hsu, Sheng-Hao et al, "Omniphobic Low Moisture Permeation Transparent Polyacrylate/Silica Nanocomposite", Mar. 18, 2013; ACS Applied Materials & Interfaces, ACS Publications, pp. 2991-2998.*

*Primary Examiner* — Ajay K Arora
(74) *Attorney, Agent, or Firm* — Dentons US LLP (57) ABSTRACT

Provided are a pressure-sensitive adhesive film and a method of manufacturing an organic electronic device using the same. The pressure-sensitive adhesive film that may effectively block moisture or oxygen penetrated into an organic electronic device from an external environment, and exhibit reliability under harsh conditions such as high temperature and high humidity and excellent optical characteristics is provided.

16 Claims, 2 Drawing Sheets

(51) Int. Cl.

| | | |
|---|---|---|
| H01L 51/00 | (2006.01) | |
| H01L 51/56 | (2006.01) | |
| H01L 51/52 | (2006.01) | |
| C09J 9/00 | (2006.01) | |
| C09J 4/00 | (2006.01) | |
| C09J 7/00 | (2006.01) | |
| C09J 7/02 | (2006.01) | |
| C09J 123/22 | (2006.01) | |
| C09J 133/08 | (2006.01) | |
| C09J 145/00 | (2006.01) | |

(52) U.S. Cl.
CPC .............. *C09J 7/021* (2013.01); *C09J 7/0214* (2013.01); *C09J 7/0217* (2013.01); *C09J 9/00* (2013.01); *C09J 123/22* (2013.01); *C09J 133/08* (2013.01); *C09J 145/00* (2013.01); *H01L 51/0001* (2013.01); *H01L 51/004* (2013.01); *H01L 51/0026* (2013.01); *H01L 51/0043* (2013.01); *H01L 51/0094* (2013.01); *H01L 51/5237* (2013.01); *H01L 51/5246* (2013.01); *H01L 51/5253* (2013.01); *H01L 51/5256* (2013.01); *H01L 51/5259* (2013.01); *H01L 51/56* (2013.01); *C09J 2201/606* (2013.01); *C09J 2203/326* (2013.01); *C09J 2409/00* (2013.01); *C09J 2415/003* (2013.01); *C09J 2423/00* (2013.01); *C09J 2423/003* (2013.01); *C09J 2433/003* (2013.01); *Y10T 428/2883* (2015.01)

(56) References Cited

U.S. PATENT DOCUMENTS

| | | | | |
|---|---|---|---|---|
| 2010/0047518 A1* | 2/2010 | Husemann | ............. | B32B 5/022 428/141 |
| 2010/0182679 A1* | 7/2010 | Han | ..................... | C09J 133/14 359/359 |
| 2012/0258305 A1* | 10/2012 | Haruta | .................. | C09J 7/0296 428/336 |
| 2013/0040137 A1* | 2/2013 | Morimoto | ............. | C09J 143/02 428/355 CN |
| 2014/0322526 A1 | 10/2014 | Dollase et al. | | |
| 2015/0188085 A1 | 7/2015 | Yoo et al. | | |

FOREIGN PATENT DOCUMENTS

| | | |
|---|---|---|
| CN | 101743779 A | 6/2010 |
| CN | 101370889 B | 2/2012 |
| DE | 10-2009-012272 A1 | 9/2010 |
| EP | 2610319 A1 | 7/2013 |
| JP | 60-92343 A | 5/1985 |
| JP | 2004-307579 A | 11/2004 |
| JP | 2010209168 A | 9/2010 |
| JP | 2013-120804 A | 6/2013 |
| KR | 10-2006-0106721 A | 10/2006 |
| KR | 10-2008-0088606 A | 10/2008 |
| KR | 10-2013-0063938 A | 6/2013 |
| KR | 10-2013-0072180 A | 7/2013 |
| KR | 10-2013-0081261 A | 7/2013 |
| TW | 201002796 A1 | 1/2010 |
| TW | 201005063 A1 | 2/2010 |
| TW | 201323571 A1 | 6/2013 |
| TW | 201329178 A1 | 7/2013 |
| TW | 201329193 A1 | 7/2013 |
| WO | 2006/107748 A1 | 10/2006 |
| WO | 2007/111607 A1 | 10/2007 |
| WO | 2008/144080 A1 | 11/2008 |
| WO | 2013/057264 A1 | 4/2013 |
| WO | 2013/103281 A1 | 7/2013 |
| WO | 2015/129625 A1 | 9/2015 |

* cited by examiner

PRESSURE SENSITIVE ADHESIVE FILM AND METHOD OF MANUFACTURING ORGANIC ELECTRONIC DEVICE USING THE SAME

This application is a National Stage Entry of International Application No. PCT/KR2014/007235, filed Aug. 5, 2014, and claims the benefit of Korean Application No. 10-2013-0092782, filed on Aug. 5, 2013, and Korean Application No. 10-2014-0040817, filed Apr. 4, 2014, all of which are hereby incorporated by reference in their entirety for all purposes as if fully set forth herein.

BACKGROUND

1. Field of the Invention

The present invention relates to a pressure-sensitive adhesive film, and a method of manufacturing an organic electronic device using the same.

2. Discussion of Related Art

An organic electronic device (OED) refers to a device including an organic material layer generating alternation of charges using holes and electrons, and may include, for example, a photovoltaic device, a rectifier, a transmitter and an organic light emitting diode (OLED).

A representative OED, which is an OLED, has less power consumption and a higher response speed, and forms a thinner display device or light than a conventional light source. In addition, the OLED has excellent space utilization, and is expected to be applied in various fields including all kinds of portable devices, monitors, notebook computers and TVs.

To extend commercialization and use of the OLED, a major problem is durability. Organic materials and metal electrodes included in the OLED are very easily oxidized by external factors such as water. Accordingly, a product including the OLED is very sensitive to environmental factors. Therefore, various methods for preventing penetration of oxygen or water from an external environment with respect to an organic electronic device such as the OLED have been suggested.

In Korean Unexamined Patent No. 2008-0088606, an adhesive capsulating composition and an organic electroluminescence device are provided, and have poor processability as a pressure-sensitive adhesive based on polyisobutylene (PIB), and low reliability at high temperature and high humidity.

Accordingly, in an organic electronic device, it is required to develop an encapsulant ensuring a required life span, excellently preventing penetration of moisture, maintaining reliability at high temperature and high humidity, and having excellent optical characteristics.

SUMMARY OF THE INVENTION

The present invention is directed to providing a pressure-sensitive adhesive film which can have a structure effectively preventing moisture or oxygen penetrated into an organic electronic device from an external environment, and excellent mechanical characteristics such as handleability and processability and excellent transparency.

In one aspect, the present invention provides a pressure-sensitive adhesive film. The pressure-sensitive adhesive film may be applied to, for example, encapsulation or capsulation of an organic electronic device such as an OLED.

The term "organic electronic device" used herein refers to a product or device having a structure including an organic material layer generating alternation of charges using holes and electrons between a pair of electrodes facing each other, and may include, but is not limited to, for example, a photovoltaic device, a rectifier, a transmitter and an organic light emitting diode (OLED). In one example, the organic electronic device may be an OLED.

The exemplary pressure-sensitive adhesive film may include a pressure-sensitive adhesive having an elastic portion (Ep; unit: %) calculated by Equation 1 of 20 to 80:

$$Ep\ (\text{unit: \%}) = 100 \times \sigma 2/\sigma 1 \qquad [\text{Equation 1}]$$

In Equation, 1, $\sigma 1$ is the maximum stress value measured when 50% strain is applied to the film by applying approximately 200 gf of normal force with a parallel plate in a relaxation test mode at 80° C. using an advanced rheometric expression system (ARES) while a pressure-sensitive adhesive film is manufactured to have a thickness of 600 μm, and $\sigma 2$ is a stress value measured after the film is maintained for 180 seconds while the strain is applied to the film.

The pressure-sensitive adhesive film, as described above, may be applied to encapsulation or capsulation of an organic electronic device such as an OLED. The pressure-sensitive adhesive film in the range of the above-described value (Ep) may have an encapsulation or capsulation structure having excellent durability without bubbles under a high temperature durability test condition when being applied to an encapsulation or capsulation process. In one example, the pressure-sensitive adhesive film may be used to form an encapsulation or capsulation structure covering all of top and side surfaces of an element of the organic electronic device that will be described below.

The term "ARES" used herein is a rheology measurer evaluating viscoelastic properties such as viscosity, shear modulus, loss factor, and storage modulus of a material. The measurer is a mechanical measuring device that can measure a transfer torque to an extent that a sample is resistant to an applied stress as described above after a dynamic state and a normal state are applied to the sample.

The exemplary pressure-sensitive adhesive film, as described above, may have a value (Ep) calculated by Equation 1 of 20 to 80. The lower limit of the value (Ep) may be, in another example, 25, 27, 29, 31 or 33. In addition, the upper limit of the value (Ep) may be, in another example, 75, 70, 65, 60, 55, 50, 45, 40 or 37. When a composition or crosslinking condition constituting a pressure-sensitive adhesive film is controlled to have such a value (Ep), a pressure-sensitive adhesive film that can realize an encapsulation or capsulation structure having excellent durability with respect to an electronic device may be provided.

Figure 4:
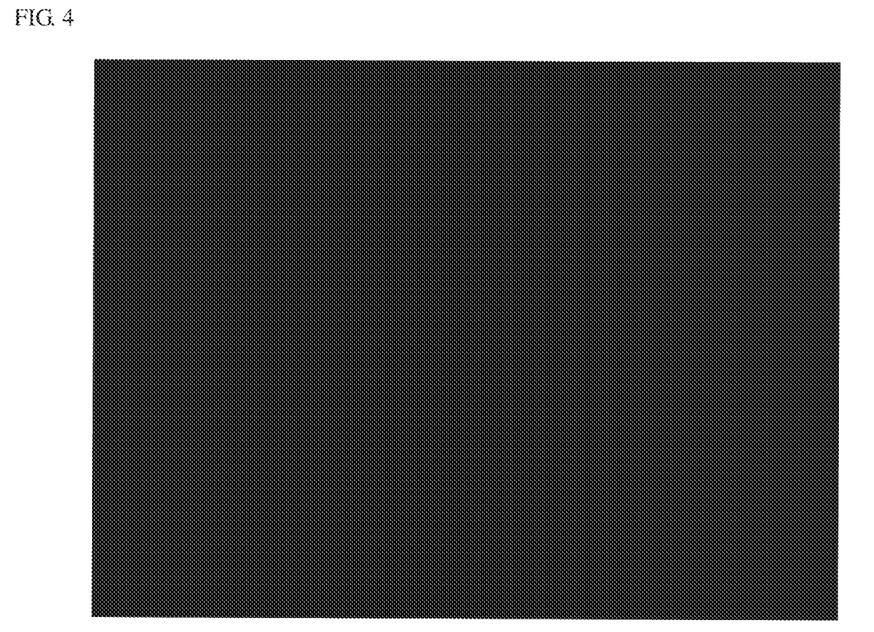
FIGS. 4 and 5 are planar views showing results of high temperature durability tests performed on pressure-sensitive adhesive films according to exemplary embodiments of the present invention.
Figure 5:
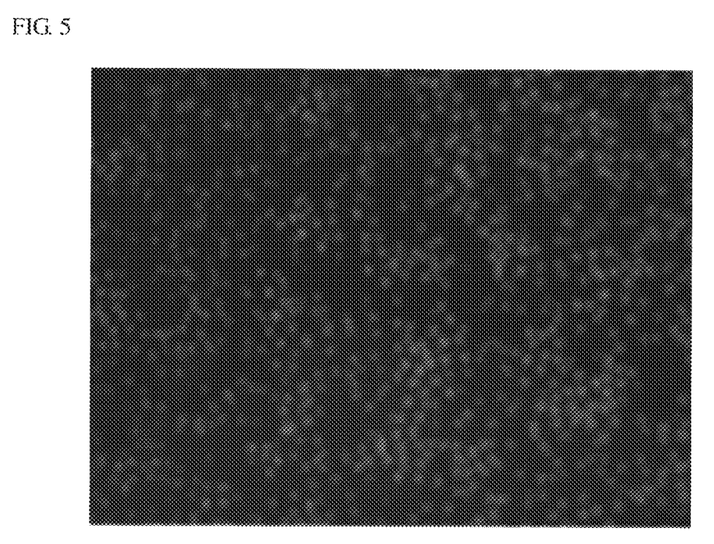

FIG. 4 shows a result of a high temperature durability test measured with respect to an encapsulation structure realized by a pressure-sensitive adhesive film having an Ep level of approximately 35, and FIG. 5 shows a result of a high temperature durability test measured with respect to an encapsulation structure realized by a pressure-sensitive adhesive film having an Ep level of approximately 16.7. As seen by comparing FIGS. 4 and 5, when the Ep level is in the range of 20 to 80, a structure having excellent durability without bubbles is realized, but when the Ep level is in the range of approximately 16.7, a lot of bubbles are observed, resulting in a decrease in durability.

In one example, the pressure-sensitive adhesive film of the present invention may include a pressure-sensitive adhesive having a gel content represented by Equation 2 of 50% or more.

$$\text{Gel content (wt \%)} = B/A \times 100 \qquad [\text{Equation 2}]$$

In Equation 2, A is a mass of the pressure-sensitive adhesive, and B is a dry mass of an insoluble content of the pressure-sensitive adhesive remaining after being dipped in toluene at 60° C. for 24 hours and filtered through a 200-mesh sieve (pore size of 200 μm).

The gel content represented by Equation 2 may be 50 to 99%, 50 to 90%, 50 to 80%, or 50 to 70%. That is, in the present invention, a pressure-sensitive adhesive film having excellent moisture barrier characteristic, reliability and optical characteristic may be realized by determining a crosslinking structure and a degree of crosslinking in a suitable range of the pressure-sensitive adhesive film through a gel content.

FIG. 4 is a result of a high temperature durability test measured with respect to an encapsulation structure realized by a pressure-sensitive adhesive film having a gel content of approximately 65, and FIG. 5 is a result of a high temperature durability test measured with respect to an encapsulation structure realized by a pressure-sensitive adhesive film having a gel content of approximately 40. As seen by comparing FIGS. 4 and 5, when the gel content is 50 or more, a structure having excellent durability without bubbles is realized, and when a gel content is less than 50, a lot of bubbles are observed, resulting in a decrease in durability.

In an exemplary embodiment of the present invention, before or after the pressure-sensitive adhesive film has a crosslinked structure, when the pressure-sensitive adhesive film has a width of 1 inch, and maintained at 25° C. and a relative humidity of 50% for 1 hour, the film may have a peeling strength of 1,000 gf/inch (peeling rate: 5 mm/sec, peeling angle: 180 degrees) with respect to a glass substrate. The peeling strength may be measured using a texture analyzer according to ASTM3330. When a composition or crosslinking structure of the pressure-sensitive adhesive composition constituting the pressure-sensitive adhesive film is controlled to have such a peeling strength, a pressure-sensitive adhesive composition that can realize an encapsulation or capsulation structure having excellent durability with respect to an electronic device may be provided.

In addition, when being manufactured to have a thickness of 100 μm, the pressure-sensitive adhesive film according to the present invention may have a water vapor transmission rate (WVTR) measured in a thickness direction of the film at 100° F. and a relative humidity of 100% of 50, 40, 30, 20 or 10 g/m$^2$·day or less. As a composition or crosslinking structure of a pressure-sensitive adhesive is controlled to have such a WVTR, an encapsulation or capsulation structure that can stably protect an element by effectively blocking moisture or oxygen penetrated from an external environment when being applied to the encapsulation or capsulation structure of the electronic device. As the WVTR is decreased, excellent moisture barrier ability may be exhibited, and the lower limit may be, for example, 0 g/m$^2$·day, but the present invention is not particularly limited.

The pressure-sensitive adhesive film of the present invention may include a pressure-sensitive adhesive, and may be formed in layers. A material of the pressure-sensitive adhesive composition constituting the pressure-sensitive adhesive is not particularly limited as long as it satisfies Equation 1, and may be suitably designed by one of ordinary skill in the art according to a purpose of the present invention within the range satisfying Equation 1. For example, the pressure-sensitive adhesive composition may include an encapsulating resin and a multifunctional active energy ray-polymerizable compound that can be polymerized by irradiation of an active energy ray.

In one exemplary embodiment of the present invention, the encapsulating resin may have a glass transition temperature of less than 0, −10, −30, −50, or −60° C. Here, the glass transition temperature may refer to a glass transition temperature after a UV ray is irradiated at a dose of approximately 1 J/cm$^2$ or more, or a glass transition temperature after thermal curing is additionally performed after UV irradiation.

In one example, the encapsulating resin may include a styrene-based resin or an elastomer, a polyolefin-based resin or an elastomer, other elastomers, a polyoxyalkylene-based resin or an elastomer, a polyester-based resin or an elastomer, a polyvinylchloride-based resin or an elastomer, a polycarbonate-based resin or an elastomer, a polyphenylenesulfide-based resin or an elastomer, a mixture of hydrocarbon, a polyamide-based resin or an elastomer, an acrylate-based resin or an elastomer, an epoxy-based resin or an elastomer, a silicone-based resin or an elastomer, a fluorine-based resin or an elastomer, or a mixture thereof.

Here, the styrene-based resin or an elastomer may be, for example, a styrene-ethylene-butadiene-styrene (SEBS) block copolymer, a styrene-isoprene-styrene (SIS) block copolymer, an acrylonitrile-butadiene-styrene (ABS) block copolymer, an acrylonitrile-styrene-acrylate (ASA) block copolymer, a styrene-butadiene-styrene (SBS) block copolymer, a styrene-based homopolymer or a mixture thereof. The olefin-based resin or an elastomer may be, for example, a high density polyethylene-based resin or an elastomer, a low density polyethylene-based resin or an elastomer, a polypropylene-based resin or an elastomer or a mixture thereof. The elastomer may be, for example, an ester-based thermoplastic elastomer, an olefin-based elastomer, a silicone-based elastomer, an acrylic elastomer or a mixture thereof. Among these, the olefin-based thermoplastic elastomer may be a polybutadiene resin or an elastomer or a polyisobutylene resin or an elastomer. The polyoxyalkylene-based resin or an elastomer may be, for example, a polyoxymethylene-based resin or an elastomer, a polyoxyethylene-based resin or an elastomer or a mixture thereof. The polyester-based resin or an elastomer may be, for example, a polyethylene terephthalate-based resin or an elastomer, a polybutylene terephthalate-based resin or an elastomer or a mixture thereof. The polyvinylchloride-based resin or an elastomer may be, for example, polyvinylidene chloride. The encapsulating resin may include a mixture resin of hydrocarbon, for example, hexatriacontane or paraffin. The polyamide-based resin or an elastomer may be, for example, nylon. The acrylate-based resin or an elastomer may be, for example, polybutyl(meth)acrylate. The epoxy-based resin or an elastomer may be, for example, a bisphenol-type such as a bisphenol A-type, a bisphenol F-type, a bisphenol S-type, and a hydrogenated product thereof; a novolac-type such as a phenolnovolac-type or a cresolnovolac-type; a nitrogen-containing ring-type such as a triglycidylisocyanurate-type or a hydantoin-type; an alicyclic-type; an aliphatic-type; an aromatic-type such as a naphthalene-type or a biphenyl-type; a glycidyl-type such as a glycidylether-type, a glycidylamine-type, or a glycidylester-type; a dicyclo-type such as dicyclopentadiene-type; an ester-type; an etherester-type; or a mixture thereof. The silicone-based resin or an elastomer may be, for example, polydimethylsiloxane. In addition, the fluorine-based resin or an elastomer may be a polytrifluoroethylene resin or an elastomer, a polytetrafluoroethylene resin or an elastomer, a polychlorotrifluoroethylene resin or an elastomer, a polyhexafluoropropylene resin or an elastomer, polyvinylidene fluoride, polyvinyl fluoride, polyethylenepropylene fluoride, or a mixture thereof.

The above-listed resins or elastomers may be grafted to, for example, maleic anhydride, copolymerized with another one of the listed resins or elastomers or a monomer for preparing the resin or elastomer, or modified by a compound, other than the above-used resins or elastomers. The compound may be a carboxyl-terminated butadiene-acrylonitrile copolymer.

In one example, the pressure-sensitive adhesive composition is an encapsulating resin, which may include an olefin-based elastomer, a silicone-based elastomer or an acrylic elastomer of the above-described types, but the present invention is not limited thereto.

Specifically, the encapsulating resin may be a copolymer of a diene and an olefin-based compound having one carbon-carbon double bond. Here, the olefin-based compound may include isobutylene, propylene or ethylene, and the diene may be a monomer capable of being polymerized with the olefin-based compound, for example, 1-butene, 2-butene, isoprene or butadiene. That is, the encapsulating resin of the present invention may be, for example, a homopolymer of an isobutylene monomer; a copolymer prepared by copolymerizing an isobutylene monomer with a monomer capable of being polymerized therewith; or a mixture thereof. In one example, the copolymer of the diene and the olefin-based compound having one carbon-carbon double bond may be a butyl rubber. When a specific resin is used as described above, moisture barrier ability that would be achieved in the present invention may be satisfied. In addition, the present invention may improve humidity resistance and heat resistance by preparing a specific composition satisfying an elastic portion according to Equation 1 described above due to low heat resistance, while a conventional isobutylene polymer has low moisture permeability.

In the pressure-sensitive adhesive composition, the resin or elastomer component may have a weight average molecular weight (Mw) to an extent that the pressure-sensitive adhesive composition can be plasticized in a film type. For example, the resin or elastomer may have a weight average molecular weight (Mw) of approximately 100,000 to 2,000,000, 100,000 to 1,500,000 or 100,000 to 1,000,000. The term "weight average molecular weight" used herein refers to a converted value with respect to standard polystyrene measured by gel penetration chromatography (GPC). However, the resin or elastomer component is not necessary to have the above-mentioned weight average molecular weight. For example, when a molecular weight of the resin or elastomer component is not sufficient for forming a film, a separate binder resin may be blended in the pressure-sensitive adhesive composition.

In addition, the pressure-sensitive adhesive composition of the present invention may include an active energy ray-polymerizable compound having high compatibility with the encapsulating resin, and capable of forming a specific crosslinking structure with the encapsulating resin.

For example, the pressure-sensitive adhesive composition of the present invention may include a multifunctional active-energy ray polymerizable compound that can be polymerized with the encapsulating resin by irradiation of an active energy ray. The active energy ray-polymerizable compound may refer to, for example, a compound including at least two of functional groups that can participate in a polymerization reaction by irradiation of an active energy ray, for example, a functional group including an ethylene-like unsaturated double bond such as an acryloyl group or a methacryloyl group, and a functional group such as an epoxy group or an oxetane group.

As the multifunctional active energy ray-polymerizable compound, for example, a multifunctional acrylate (MFA) may be used.

In addition, the multifunctional active energy ray-polymerizable compound that can be polymerized by the irradiation of an active energy ray may satisfy Formula 1. In addition, the active energy ray-polymerizable compound may be included at 5 to 30, 5 to 25, 8 to 20, 10 to 18 or 12 to 18 parts by weight relative to 100 parts by weight of the encapsulating resin.

[Formula 1]

In Formula 1, $R_1$ is hydrogen or an alkyl group having 1 to 4 carbon atoms, n is an integer of 2 or more, and X is a residue induced from a linear, branched or cyclic alkyl group having 3 to 30 carbon atoms. Here, when X is a residue induced from a cyclic alkyl group, X may be, for example, a residue induced from a cyclic alkyl group having 3 to 30, 6 to 28, 8 to 22, or 12 to 20 carbon atoms. In addition, when X is a residue induced from a linear alkyl group, X may be a residue induced from a linear alkyl group having 3 to 30, 6 to 25, or 8 to 20 carbon atoms. In addition, when X is a residue induced from a branched alkyl group, X may be a residue induced from a branched alkyl group having 3 to 30, 5 to 25, or 6 to 20 carbon atoms.

The term "residue induced from an alkyl group" used herein may refer to a residue of a specific compound composed of an alkyl group. In one example, in Formula 1, when n is 2, X may be an alkylene group. In addition, when n is 3 or more, at least two hydrogens of the alkyl group may be released from X, and then bind to a (meth)acryloyl group of Formula 1.

The term "alkyl group" used herein may refer to, but is not particularly defined otherwise, an alkyl group having 1 to 30, 1 to 25, 1 to 20, 1 to 16, 1 to 12, 1 to 8 or 1 to 4 carbon atoms. The alkyl group may have a linear, branched or cyclic structure, and may be optionally substituted by at least one substituent.

The term "alkylene group" used herein may be, but is not particularly defined otherwise, an alkylene group having 2 to 30, 2 to 25, 2 to 20, 2 to 16, 2 to 12, 2 to 10 or 2 to 8 carbon atoms. The alkylene group may have a linear, branched or cyclic structure, and may be optionally substituted by at least one substituent.

The term "alkoxy group" used herein may be, unless particularly defined otherwise, an alkoxy group having 1 to 20, 1 to 16, 1 to 12, 1 to 8 or 1 to 4 carbon atoms. The alkoxy group may be a linear, branched or cyclic type. In addition, the alkoxy group may be optionally substituted by at least one substituent.

The multifunctional active energy ray-polymerizable compound that can be polymerized by the irradiation of an active energy ray may be any one satisfying Formula 1 without limitation. For example, the compound may be 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-dimethanol di(meth)acrylate, tricyclodecanedimethanol(meth)diacrylate, dimethylol dicyclopentane di(meth)acrylate, neopentyl glycol modified trimethylpropane di(meth)acrylate, adamantane di(meth)acrylate, trimethylolpropane tri(meth)acrylate, or a mixture thereof.

As the multifunctional active energy ray-polymerizable compound, for example, a compound having a molecular weight of less than 1,000 and including at least two functional groups may be used. In this case, the molecular weight may refer to a weight average molecular weight or a conventional molecular weight. A cyclic structure included in the multifunctional active energy ray-polymerizable compound may be any one of a carbocyclic structure, a heterocyclic structure, a monocyclic structure and a polycyclic structure.

In one exemplary embodiment of the present invention, the pressure-sensitive adhesive composition may include a silane compound satisfying Formula 2:

[Formula 2]

In Formula 2, $R_1$ is hydrogen or an alkyl group. $R_1$ may be, for example, an alkyl group having 1 to 4 or 1 to 2 carbon atoms. In addition, in Formula 2, $R_2$ and $R_3$ are each independently hydrogen, or a linear, branched or cyclic alkyl group, or $R_2$ is linked with $R_3$, thereby forming a cyclic alkyl group. For example, $R_2$ and $R_3$ may be each independently hydrogen, or a linear, branched or cyclic alkyl group. Here, the linear alkyl group may have 1 to 10, 1 to 6, or 1 to 4 carbon atoms, the branched alkyl group may have 3 to 10, 3 to 6 or 3 to 4 carbon atoms, and the cyclic alkyl group may have 3 to 10, 3 to 8, 3 to 6, or 3 to 4 carbon atoms. In addition, $R_2$ may be linked with $R_3$, thereby forming a cyclic alkyl group having 2 to 10, 3 to 10, 4 to 9, or 4 to 8 carbon atoms. In addition, in Formula 2, $R_4$, $R_5$ and $R_6$ are each independently hydrogen, an alkyl group or an alkoxy group, at least one of $R_4$, $R_5$ and $R_6$ is an alkoxy group, and n is an integer of 1 or more. Particularly, $R_4$, $R_5$ and $R_6$ are each independently an alkyl group having 1 to 10, 1 to 6, 1 to 4 or 1 to 2 carbon atoms; or an alkoxy group having 1 to 10, 1 to 8, 1 to 4 or 1 to 2 carbon atoms. Here, at least one of $R_4$, $R_5$ and $R_6$ may be an alkoxy group, and all of $R_4$, $R_5$ and $R_6$ may be alkoxy groups, but the present invention is not limited thereto.

In one example, the silane compound is not particularly limited, as long as it satisfies Formula 2, and may be, for example, 3-methacryloxypropyl trimethoxysilane, 3-methacryloxy propyl triethoxysilane, 3-acryloxy propyl trimethoxysilane, 3-acryloxy propyl triethoxysilane, 3-methacryloxy methyl triethoxysilane, 3-methacryloxy methyl trimethoxysilane, 3-acryloxy propyl methyldimethoxysilane, methacryloxy methyl methyldimethoxysilane, methacryloxy methyl methyldiethoxysilane, methacryloxy propyl methyldimethoxysilane, methacryloxy propyl methyldiethoxysilane, methacryloxy propyl dimethylmethoxysilane or methacryloxy propyl dimethylethoxysilane. An acryl group of the silane compound may serve to increase an interface pressure-sensitive adhesive strength and to ensure reliability at high temperature and high humidity by being crosslinked with the encapsulating resin or active energy ray-polymerizable compound of the pressure-sensitive adhesive composition. The silane compound may be included at, for example, 0.1 to 10, 0.5 to 8, 0.8 to 5, 1 to 5, 1 to 4.5, or 1 to 4 parts by weight relative to 100 parts by weight of the encapsulating resin.

In one example, the active energy ray-polymerizable compound may form a crosslinking structure with the silane compound satisfying Formula 2, and the crosslinking structure may form a semi-interpenetrating polymer network (semi-PIN) with the encapsulating resin. That is, the pressure-sensitive adhesive composition may include a semi-IPN. The term "semi-IPN" includes at least one polymer crosslinking structure (polymer network) and at least one linear or branched polymer, and at least a part of the linear or branched polymer has a structure penetrated into the polymer crosslinking structure. The semi-IPN may be distinguished from an IPN structure since the linear or branched polymer can be theoretically separated from the polymer crosslinking structure without loss of a chemical bond.

In one exemplary embodiment, the crosslinking structure may be a crosslinking structure formed by application of heat, a crosslinking structure formed by irradiation of an active energy ray or a crosslinking structure formed by aging at room temperature. Here, in the category of the "active energy ray", a microwave, an infrared (IR) ray, an ultraviolet (UV) ray, an X ray and a gamma ray, and a particle beam such as an alpha-particle beam, a proton beam, a neutron beam or an electron beam, and conventionally, an UV ray and an electron beam may be included. As such a semi-IPN structure is introduced, a mechanical property such as processability of the pressure-sensitive adhesive composition may be increased, humidity-resistant adhesive performance is improved, transparency is realized, high moisture barrier performance that cannot be achieved so far, and an excellent panel life span may be realized.

In one example, the active energy ray-polymerizable compound may form a crosslinking structure with the silane compound satisfying Formula 2, and the encapsulating resin may form a crosslinking structure with the active energy ray-polymerizable compound or the silane compound satisfying Formula 2, thereby forming an interpenetrating polymer network (IPN) structure. In addition, the term "IPN structure" refers to a state in which at least two crosslinking structures are present in a pressure-sensitive adhesive. In one example, the IPN structure may refer to a structure including at least two crosslinking structures in an intertwining, entanglement or penetrating state. For example, the composition of the present invention may include a crosslinking structure by an encapsulating resin (hereinafter, referred to as a "first crosslinking structure") and a crosslinking structure formed by a reaction of an active energy ray-polymerizable compound and the silane compound satisfying Formula 1 (hereinafter, referred to as a "second crosslinking structure"), and the first and second crosslinking structures may be in an intertwining state or an entanglement state. That is, as the pressure-sensitive adhesive composition includes a semi-IPN or IPN structure in a crosslinked state, a pressure-sensitive adhesive strength of the pressure-sensitive adhesive is increased at high temperature and high humidity, and moisture barrier ability and heat resistance may be improved.

In an exemplary embodiment of the present invention, the pressure-sensitive adhesive composition may further include a radical initiator that can induce a polymerization reaction of the above-described active energy ray-polymerizable compound. The radical initiator may be a photoinitiator or a thermal initiator. A specific type of the photoinitiator may be suitably selected in consideration of a curing rate and possibility of yellowing. For example, as the photoinitiator, a benzoin-, hydroxy ketone-, amino ketone- or phosphine oxide-based photoinitiator, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-lone, 1-hydroxycyclohexylphenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methyl thioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone], or 2,4,6-trimethylbenzoyl-diphenyl-phosphineoxide may be used.

The radical initiator may be included at 0.2 to 20, 0.5 to 18, 1 to 15, or 2 to 13 parts by weight relative to 100 parts by weight of the active energy ray-polymerizable compound. Accordingly, the reaction of the active energy ray-polymerizable compound is effectively induced, and degradation of physical properties of the pressure-sensitive adhesive composition due to remaining components after curing may be prevented.

In one example, the pressure-sensitive adhesive composition may further include a tackifier. The tackifier may be a hydrogenated cyclic olefin-based polymer. As the tackifier, for example, a hydrogenated petroleum resin obtained by hydrogenating a petroleum resin may be used. The hydrogenated petroleum resin may be partially or completely hydrogenated, and may be a mixture of such resins. Such a tackifier may have a high compatibility with the pressure-sensitive adhesive composition, excellent moisture barrier ability, and a small content of an organic volatile component. A specific example of the hydrogenated petroleum resin may be a hydrogenated terpene-based resin, a hydrogenated ester-based resin or a hydrogenated dicyclopentadiene-based resin. The tackifier may have a weight average molecular weight of approximately 200 to 5,000. A content of the tackifier may be suitably controlled as needed. For example, the content of the tackifier may be selected in consideration of a gel content that will be described below. According to one example, the tackifier may be included at 5 to 100, 8 to 95, 10 to 93 of 15 to 90 parts by weight relative to 100 parts by weight of a solid content of the pressure-sensitive adhesive composition.

The pressure-sensitive adhesive composition may further include a moisture absorbent when needed. The term "moisture absorbent" may refer to a material that can remove moisture or vapor penetrated into the following pressure-sensitive adhesive film through a chemical reaction. When the pressure-sensitive adhesive composition of the present invention includes a moisture absorbent, to be formed in a film, the following light transmittance may not be realized, but excellent moisture barrier ability may be realized. Specifically, the pressure-sensitive adhesive composition may be formed in a film to be applied to encapsulation of an organic electronic device. In this case, when the pressure-sensitive adhesive composition does not include a moisture absorbent, and exhibits excellent transparency, it may be applied to encapsulation of a top-emissive organic electronic device, or when the pressure-sensitive adhesive composition includes a moisture absorbent, and exhibit excellent moisture barrier ability, it may be applied to encapsulation of a bottom-emissive organic electronic device. However, the present invention is not limited thereto. That is, when the pressure-sensitive adhesive composition does not include a moisture absorbent, and exhibits excellent transparency, it may be applied to encapsulation of a bottom-emissive organic electronic device.

For example, the moisture absorbent may be present while being uniformly dispersed in the pressure-sensitive adhesive composition or the following pressure-sensitive adhesive. Here, the uniformly dispersed state may mean that the state in which the moisture absorbent is present even in any part of the pressure-sensitive adhesive composition or the pressure-sensitive adhesive at the same or substantially the same density. As the moisture absorbent used herein, for example, a metal oxide, a sulfate or an organic metal oxide may be used. Specifically, the sulfate may be magnesium sulfate, sodium sulfate or nickel sulfate, and the organic metal oxide may be aluminum oxide octylate. Here, the metal oxide may be phosphorous pentoxide ($P_2O_5$), lithium oxide ($Li_2O$), sodium oxide ($Na_2O$), barium oxide (BaO), calcium oxide (CaO) or magnesium oxide (MgO), and the metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), but the present invention is not limited thereto. As the moisture absorbent that can be included in the pressure-sensitive adhesive composition, one or at least two of the above-described materials may be used. In one example, when at least two of the above materials are used, the moisture absorbent may be calcined dolomite.

Such a moisture absorbent may be controlled in a suitable size according to its use. In one example, an average diameter of the moisture absorbent may be controlled to approximately 10 to 15000 nm. A moisture absorbent having the above range of the average diameter may be easy to be stored due to a not too high reaction speed with moisture, and may effectively remove moisture without damage to an element to be encapsulated.

A content of the moisture absorbent may be suitably selected without particular limitation in consideration of a desired barrier characteristic.

The pressure-sensitive adhesive composition may further include a moisture blocker when needed. The term "moisture blocker" used herein may refer to a material that can block or prevent migration of moisture or vapor in the film while having no or low reactivity with moisture. As the moisture blocker, one or at least two of clay, talc, acicular silica, planar silica, porous silica, zeolite, titania and zirconia may be used. In addition, a surface of the water blocker may be treated with an organic modifier to facilitate penetration of an organic material. Such an organic modifier, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium or a mixture thereof may be used.

A content of the moisture blocker may be suitably selected without particular limitation in consideration of a desired blocking characteristic.

In addition to the above-described components, various additives may be included in the pressure-sensitive adhesive composition according to its use and a process of manufacturing a pressure-sensitive adhesive film that will be described below. For example, the pressure-sensitive adhesive composition may include a curable material, a cross-linking agent or a filler in a suitable range of content according to a desired physical property.

In an exemplary embodiment of the present invention, the pressure-sensitive adhesive film may be formed in a monolayer structure including a pressure-sensitive adhesive as described above, or may be formed of at least two layers that will be described below. For example, the pressure-sensitive adhesive film may include a first layer containing the above-described pressure-sensitive adhesive and a second layer including a pressure-sensitive adhesive resin or an adhesive resin. The pressure-sensitive adhesive resin or adhesive resin included in the second layer may be the same as or different from the above-described encapsulating resin, and may be suitably selected by a conventional technician according to a purpose. In addition, the first and second layers may or may not include a moisture absorbent.

In one example, the pressure-sensitive adhesive resin included in the second layer may include a curable resin including at least one heat-curable functional group such as a glycidyl group, an isocyanate group, a hydroxyl group, a carboxyl group or an amide group, or an electromagnetic wave-curable functional group such as an epoxide group, a cyclic ether group, a sulfide group, an acetal group or a lactone group, which may be cured to exhibit an adhesive characteristic. In addition, a specific type of such a resin may be, but is not limited to, an acryl resin, a polyester resin, an isocyanate resin, or an epoxy resin.

In the present invention, as the curable resin, an aromatic or aliphatic, or linear or branched epoxy resin may be used. In one exemplary embodiment of the present invention, an epoxy resin containing at least two functional groups and having an epoxy equivalent of 180 to 1,000 g/eq may be used. When the epoxy resin having the above range of epoxy equivalent is used, characteristics of the cured product such as adhesive performance and a glass transition temperature may be effectively maintained. Such an epoxy resin may be one or a mixture of at least two of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenol methane-type epoxy resin, an alkyl-modified triphenol methane epoxy resin, a naphthalene-type epoxy resin, a dicyclopentadiene-type epoxy resin, and a dicyclopentadiene modified phenol-type epoxy resin.

In an exemplary embodiment of the present invention, the first or second layer may include another component such as an active energy ray-polymerizable compound, a radical initiator, a tackifier, a moisture absorbent, a moisture blocker, a dispersing agent or a silane compound in addition to the above-described resin, and components of the first and second layers may be the same as or different from each other. In addition, the second layer may include a curable material, a curing agent or a filler in a suitable range of content according to a desired physical property.

A sequence of laminating the first and second layers is not particularly limited, and thus the second layer may be formed on the first layer, or the first layer may be formed on the second layer. In addition, the pressure-sensitive adhesive film may be formed of at least three layers, and for example, the first layer may include at least two layers, and the second layer may include at least two layers.

In one example, the pressure-sensitive adhesive film may include a barrier film on one surface of the pressure-sensitive adhesive. The barrier film may be formed of any material generally used in the art without limitation. For example, here, the barrier film may include a base layer, an organic undercoating layer, an inorganic deposition layer and an organic top-coating layer, and the organic top-coating layer may be in contact with the pressure-sensitive adhesive.

In addition, the pressure-sensitive adhesive film may have an excellent light transmittance with respect to a visible-ray region. In one example, the pressure-sensitive adhesive film of the present invention may have a light transmittance of 85% or more with respect to the visible-ray region. For example, the pressure-sensitive adhesive film may have a light transmittance of 85%, 87% or 90% or more with respect to a visible-ray region. In addition, the pressure-sensitive adhesive film of the present invention may have a low haze in addition to the excellent light transmittance. In one example, the pressure-sensitive adhesive film may have a haze of 3%, 2%, 1%, 0.8%, 0.5%, or 0.3% or less. That is, as an elastic portion of the pressure-sensitive adhesive film according to the present invention is limited within a specific range according to Equation 1 as described above, the film may realize excellent optical characteristics as well as reliability at high temperature and high humidity.

The pressure-sensitive adhesive film may further include a base film or release film (hereinafter, can be referred to as a "first film"), and the pressure-sensitive adhesive may be formed on the base or release film. The structure may further include a base or release film formed on the pressure-sensitive adhesive (hereinafter, can be referred to as a "second film").

Figure 1:
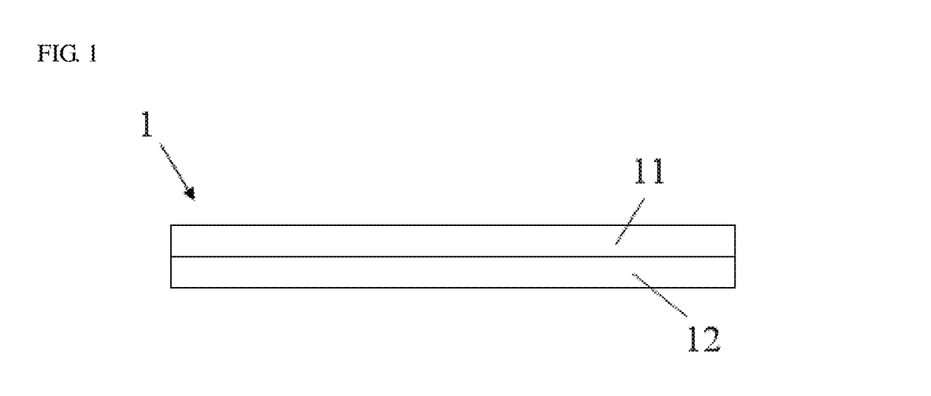
FIGS. 1 and 2 are cross-sectional views of pressure-sensitive adhesive films according to exemplary embodiments of the present invention.
Figure 2:
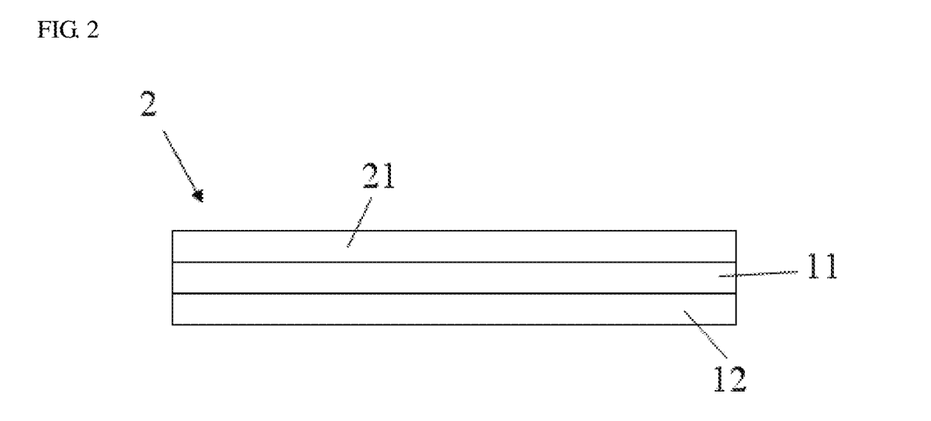

FIGS. 1 and 2 are cross-sectional views of exemplary pressure-sensitive adhesive films.

The pressure-sensitive adhesive film 1, as shown in FIG. 1, may include a pressure-sensitive adhesive 11 formed on a base or release film 12. Another exemplary pressure-sensitive adhesive film 2, as shown in FIG. 2, may further include a base or release film 21 formed on a pressure-sensitive adhesive 11. Although not shown in FIGS. 1 and 2, the pressure-sensitive adhesive film may also have the pressure-sensitive adhesive composition without a supporting base such as a base or release film, and therefore have a structure only including a pressure-sensitive adhesive formed in a film or sheet maintaining a solid phase or a semi-solid phase at room temperature, or a structure in which a pressure-sensitive adhesive is formed on both surface of one base or release film.

A specific type of the first film is not particularly limited. As the first film, for example, a plastic film may be used. The first film may be a polyethyleneterephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film.

When the first film is a release film, suitable release treatment may be performed on one or both surfaces of such a plastic film. As a releasing agent used for release treatment, an alkyde-based releasing agent, a silicone-based releasing agent, a fluorine-based releasing agent, an unsaturated ester-based releasing agent, a polyolefin-based releasing agent or a wax-based releasing agent may be used. In consideration of heat resistance, an alkyde-based releasing agent, a silicone-based releasing agent or a fluorine-based releasing agent among the above examples is conventionally used, but the present invention is not limited thereto.

As the first film, for example, a plastic film in which a gas barrier layer is formed on a top or side surface of a base may be used. Such a film may directly constitute, for example, a substrate of an organic electronic device to be used for realizing a flexible element.

A type of the second film is not particularly limited, either. For example, as the second film, within the category of the first film listed above, one that is the same as or different from the first film may be used.

A thickness of the first or second film is not particularly limited. In one example, the thickness of the first film may be approximately 50 to 500 or 100 to 200 µm. In such a range, a process of preparing or manufacturing a pressure-sensitive adhesive or an organic electronic device may be effectively automated, and advantageous effects in terms of economic feasibility may be achieved.

The thickness of the second film is not particularly limited, either. For example, the thickness of the second film may be the same as, or relatively smaller or larger than that of the first film.

The pressure-sensitive adhesive of the pressure-sensitive adhesive film includes the pressure-sensitive adhesive composition, and is formed in a film or sheet. In the pressure-sensitive adhesive, the pressure-sensitive adhesive composition may be in a crosslinked or non-crosslinked state. The pressure-sensitive adhesive may be in a solid or semi-solid phase at room temperature. Such a pressure-sensitive adhesive resin may be formed in a crosslinked structure in an encapsulation structure of an organic electronic element, which will be described below.

A thickness of the pressure-sensitive adhesive is not particularly limited, and may be suitably selected in consideration of its uses. For example, the pressure-sensitive adhesive may have a thickness of approximately 5 to 200 µm. The thickness of the pressure-sensitive adhesive may be controlled in consideration of, for example, embeddability when being used as an encapsulant of an organic electronic element and processability or economic feasibility.

In still another aspect, the present invention provides a method of manufacturing a pressure-sensitive adhesive film. The exemplary pressure-sensitive adhesive film may be manufactured by plasticizing the pressure-sensitive adhesive composition in a film or sheet.

In one example, the method may include applying a coating solution including the pressure-sensitive adhesive composition on a base or release film in a sheet or film, and drying the applied coating solution. The method may further include adhering an additional base or release film to the dried coating solution.

The coating solution including the pressure-sensitive adhesive composition may be prepared by, for example, dissolving or dispersing a component of each pressure-sensitive adhesive composition described above in a suitable solvent. In one example, the pressure-sensitive adhesive composition may be prepared by dissolving or dispersing the moisture absorbent, blocker or filler in a solvent when needed, grinding the resulting product, and mixing the moisture absorbent, blocker or filler with an encapsulating resin.

A type of a solvent used in preparation of the coating solution is not particularly limited. However, when time to dry the solvent is too long, or it is necessary to dry the solvent at high temperature, there may have some problems in workability or durability of a pressure-sensitive adhesive film. For this reason, a solvent having a volatile temperature of 150° C. or less may be used. In consideration of film moldability, a small amount of the solvent having the above range or more of the volatile temperature may be mixed to be used. The solvent may be, but is not limited to, one or at least two of methylethylketone (MEK), acetone, toluene, dimethyl formamide (DMF), methyl cellosolve (MCS), tetrahydrofuran (THF), xylene, and N-methylpyrrolidone (NMP).

A method of applying the coating solution to the base or release film may be, but is not particularly limited to, a known coating method such as knife coating, roll coating, spray coating, gravure coating, curtain coating, comma coating or lip coating.

The applied coating solution may be dried to volatilize the solvent, thereby forming a pressure-sensitive adhesive. The drying may be performed, for example, at 70 to 150° C. for 1 to 10 minutes. The drying condition may be changed in consideration of a type of the used solvent.

After drying, an additional base or release film may be formed on the pressure-sensitive adhesive.

In another aspect, the present invention provides a product for encapsulating an organic electronic device. The product for encapsulating an organic electronic device may include a substrate; an organic electronic element formed on the substrate; and a pressure-sensitive adhesive film encapsulating an entire surface, for example, both top and side surfaces of the organic electronic element. The pressure-sensitive adhesive film may include a pressure-sensitive adhesive containing a pressure-sensitive adhesive composition in a crosslinked state. The product for encapsulating an organic electronic device may further include a cover substrate formed on a top surface of the pressure-sensitive adhesive.

Here, the organic electronic element may be, for example, an organic light emitting element.

In addition, in yet another aspect, the present invention provides a method of manufacturing an organic electronic device. The product for encapsulating an organic electronic device may be manufactured using, for example, the pressure-sensitive adhesive film.

The pressure-sensitive adhesive may be formed as an encapsulating layer for a structure exhibiting excellent moisture barrier property and optical property in the organic electronic device, effectively fixing and supporting the substrate and a cover substrate.

In addition, the pressure-sensitive adhesive may exhibit excellent transparency, and may be stable regardless of a type of the organic electronic device, for example, a top-emissive or bottom-emissive organic electronic device.

The term "encapsulating layer" used herein may refer to a pressure-sensitive adhesive covering top and side surfaces of the organic electronic element.

Figure 3:
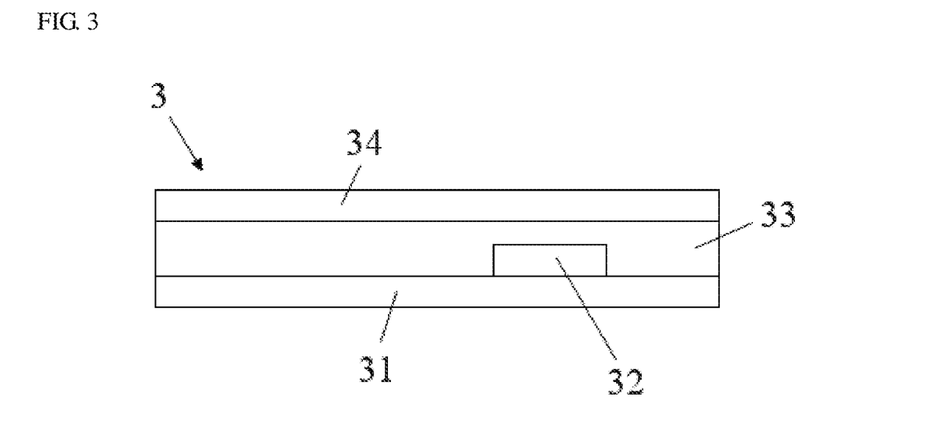
FIG. 3 is a cross-sectional view of a product for encapsulating an organic electronic device according to an exemplary embodiment of the present invention.

FIG. 3 is a schematic diagram of an exemplary organic electronic device in which an organic electronic element is an organic light emitting element.

To manufacture the organic electronic device, for example, applying the above-described pressure-sensitive adhesive film to the substrate on which the organic electronic element is formed in order to cover the organic electronic element; and curing the pressure-sensitive adhesive film may be included.

The term "curing" used herein may refer to preparing a pressure-sensitive adhesive by forming the pressure-sensitive adhesive composition of the present invention to have a crosslinking structure through heating or UV irradiation.

Specifically, an organic electronic element 32 may be formed by forming a transparent electrode on a glass or polymer film 31 used as a substrate by a method such as vacuum deposition or sputtering, forming layers of emissive organic materials, composed of, for example, a hole transport layer, an emitting layer and an electron transport layer on the transparent electrode, and further forming an electrode layer thereon. Subsequently, a pressure-sensitive adhesive of the pressure-sensitive adhesive film is disposed to cover an entire surface of the organic electronic element 32 of the substrate 31 which has gone through the above-described process.

Subsequently, an encapsulating layer may be formed by compressing the pressure-sensitive adhesive on the organic electronic element using a laminator while being heated to provide mobility, and crosslinking a resin in the pressure-sensitive adhesive.

In one example, a pressure-sensitive adhesive 33 disposed to cover an entire surface of the organic electronic element 32 may be previously transferred to a cover substrate 34 such as a glass or a polymer film. The transfer of the pressure-sensitive adhesive to the cover substrate 34 may be performed using a vacuum press or vacuum laminator while being heated in a state in which the pressure-sensitive adhesive is in contact with the cover substrate 34 after a first or second film is peeled from the pressure-sensitive adhesive film. When a pressure-sensitive adhesive includes a heat-curable pressure-sensitive adhesive resin, and a curing reaction is excessively performed during the process, a cohesive strength or pressure-sensitive adhesive strength of the encapsulating layer is probably reduced. Therefore, a process temperature may be controlled to approximately 100° C. or less, and a process time may be controlled within 5 minutes.

An encapsulating layer may be formed by disposing the cover substrate 34 to which the pressure-sensitive adhesive is transferred on the organic electronic element 32, and performing the heat compression process.

An encapsulating layer may be formed by curing the pressure-sensitive adhesive 33. The curing process may be performed in a suitable heating chamber or UV chamber, for example, according to a method of curing a curable pressure-sensitive adhesive resin. A heating condition or a condition of irradiating an active energy ray maybe suitably selected in consideration of stability of the organic electronic element and curability of the pressure-sensitive adhesive resin, and to increase compression efficiency, autoclaving may also be performed with application of heat and pressure.

Here, one example of the method of manufacturing an organic electronic device has been described, but the organic electronic device may be manufactured by a different method. For example, while the manufacture of the device is performed by the above-described method, a sequence or condition of the process may be changed. For example, the encapsulating layer may be formed by previously transferring the pressure-sensitive adhesive to the organic electronic element on the substrate 31, not to the cover substrate 34, and performing a curing process while the cover substrate 34 is laminated.

EFFECTS

A pressure-sensitive adhesive film of the present invention can be applied to encapsulation or capsulation of an organic electronic device such as an OLED. Particularly, the pressure-sensitive adhesive film can be applied to such encapsulation or capsulation to prevent bubbles at high temperature and high humidity, thereby forming an encapsulation or capsulation structure having excellent durability and reliability. The film can form a structure effectively blocking moisture or oxygen penetrated into an organic electronic device from an external environment, and have excellent mechanical properties such as handleability and processability and excellent transparency. The pressure-sensitive adhesive film may be applied to, for example, encapsulation or capsulation of a top emissive OLED.

DESCRIPTION OF REFERENCE NUMERALS 1, 2: pressure-sensitive adhesive film
11: pressure-sensitive adhesive
12: first film
21: second film
3: organic electronic device
31: substrate
32: organic electronic element
33: pressure-sensitive adhesive or encapsulating layer
34: cover substrate

DETAILED DESCRIPTION OF EXEMPLARY EMBODIMENTS

Hereinafter, the present invention will be described in detail with reference to Examples and Comparative Examples, but the scope of the present invention is not limited to the following Examples.

EXAMPLE 1

A coating solution was prepared by adding 80 g of a butyl rubber as an encapsulating resin, 20 g of tricyclodecane dimethanol diacrylate (SR833S, Sartomer Company Inc.) as an active energy ray-polymerizable compound, 0.2 g of 3-methacryloxypropyl trimethoxysilane (Sigma-Aldrich Co. LLC.) as a silane compound, and 1 g of 2,2-dimethoxy-1, 2-diphenylethane-1-one (Irgacure651, Ciba Specialty Chemicals Corporation) as a radical initiator, and diluting the mixture in toluene to have a solid content of approximately 20 wt %.

The prepared solution was coated on a released surface of release PET, and dried in an oven at 100° C. for 5 minutes, thereby manufacturing a pressure-sensitive adhesive film including a pressure-sensitive adhesive having a thickness of 30 μm. Physical properties of the sample were measured after a UV ray was irradiated at 2 J/cm² on the manufactured film.

EXAMPLE 2

A coating solution was prepared by adding 50 g of a butyl rubber as an encapsulating resin, 35 g of a hydrogenated DCPD-based tackifier (SU-125, Kolon Industries, Inc.) as a tackifier, 15 g of tricyclodecane dimethanol diacrylate (SR833S, Sartomer Company Inc.) as an active energy ray-polymerizable compound, 0.2 g of 3-methacryloxypropyl trimethoxysilane (Sigma-Aldrich Co. LLC.) as a silane compound, and 1 g of 2,2-dimethoxy-1,2-diphenylethane-1-one (Irgacure651, Ciba Specialty Chemicals Corporation) as a radical initiator, and diluting the mixture in toluene to have a solid content of approximately 30 wt %. Here, a coating solution was prepared by adding 10 g of calcium oxide (Sigma-Aldrich Co. LLC.) ball-milled with 10 g of toluene to the above solution.

The prepared solution was coated on a released surface of release PET, and dried in an oven at 100° C. for 5 minutes, thereby manufacturing a pressure-sensitive adhesive film having a thickness of 30 μm. Physical properties of the sample were measured after a UV ray was irradiated at 3 J/cm² on the manufactured film.

EXAMPLE 3

A coating solution was prepared by adding 60 g of a butyl rubber as an encapsulating resin, 30 g of a hydrogenated DCPD-based tackifier (SU-125, Kolon Industries, Inc.) as a tackifier, 10 g of tricyclodecane dimethanol diacrylate (SR833S, Sartomer Company Inc.) as an active energy ray-polymerizable compound, 0.2 g of 3-methacryloxypropyl trimethoxysilane (Sigma-Aldrich Co. LLC.) as a silane compound, and 1 g of 2,2-dimethoxy-1,2-diphenylethane-1-one (Irgacure651, Ciba Specialty Chemicals Corporation) as a radical initiator, and diluting the mixture in toluene to have a solid content of approximately 20 wt %.

The prepared solution was coated on a released surface of release PET, and dried in an oven at 100° C. for 5 minutes, thereby manufacturing a pressure-sensitive adhesive film having a thickness of 30 μm. Physical properties of the sample were measured after a UV ray was irradiated at 2 J/cm² on the manufactured film.

EXAMPLE 4

A coating solution was prepared by adding 60 g of a butyl rubber as an encapsulating resin, 20 g of a hydrogenated DCPD-based tackifier (SU-125, Kolon Industries, Inc.) as a tackifier, 20 g of tricyclodecane dimethanol diacrylate (SR833S, Sartomer Company Inc.) as an active energy ray-polymerizable compound, 0.2 g of 3-methacryloxypropyl trimethoxysilane (Sigma-Aldrich Co. LLC.) as a silane compound, and 1 g of 2,2-dimethoxy-1,2-diphenylethane-1-one (Irgacure651, Ciba Specialty Chemicals Corporation) as a radical initiator, and diluting the mixture in toluene to have a solid content of approximately 20 wt %.

The prepared solution was coated on a released surface of release PET, and dried in an oven at 100° C. for 5 minutes, thereby manufacturing a pressure-sensitive adhesive film having a thickness of 30 μm. Physical properties of the sample were measured after a UV ray was irradiated at 2 J/cm² on the manufactured film.

COMPARATIVE EXAMPLE 1

A pressure-sensitive adhesive film was manufactured by the same method as described in Example 1, except that polyisobutylene was used as an encapsulating resin, instead of a butyl rubber.

COMPARATIVE EXAMPLE 2

A coating solution was prepared by adding 55 g of a butyl rubber as an encapsulating resin, 20 g of a hydrogenated DCPD-based tackifier (SU-125, Kolon Industries, Inc.) as a tackifier, 35 g of tricyclodecane dimethanol diacrylate (SR833S, Sartomer Company Inc.) as an active energy ray-polymerizable compound, 0.2 g of 3-methacryloxypropyl trimethoxysilane (Sigma-Aldrich Co. LLC.) as a silane compound, and 1 g of 2,2-dimethoxy-1,2-diphenylethane-1-one (Irgacure651, Ciba Specialty Chemicals Corporation) as a radical initiator, and diluting the mixture in toluene to have a solid content of approximately 20 wt %.

The prepared solution was coated on a released surface of release PET, and dried in an oven at 100° C. for 5 minutes, thereby manufacturing a pressure-sensitive adhesive film having a thickness of 30 μm. Physical properties of the sample were measured after a UV ray was irradiated at 2 J/cm² on the manufactured film.

COMPARATIVE EXAMPLE 3

A coating solution was prepared by adding and homogenizing 60 g of 2-ethylhexylacrylate (Sigma-Aldrich Co. LLC.), 30 g of butyl acrylate (Sigma-Aldrich Co. LLC.) and 10 g of hydroxyethylacrylate (Sigma-Aldrich Co. LLC.) as acrylic monomers, and 3 g of 2,2-dimethoxy-1,2-diphenylethane-1-one (Irgacure651, Ciba Specialty Chemicals Corporation) as a radical initiator.

The prepared solution was coated on a released surface of release PET, thereby forming a pressure-sensitive adhesive film having a thickness of 30 μm. Physical properties of the sample were measured after a UV ray was irradiated at 2 J/cm² on the manufactured film.

1. Elastic Portion (Ep Measurement)

Values of the maximum stress σ1 were measured by laminating the pressure-sensitive adhesive films manufactured by Examples 1 to 4 and Comparative Examples 1 to 3 to have a thickness of 600 μm (pressure-sensitive adhesive layer: 600 μm), applying approximately 200 gf of normal force with a parallel plate in a relaxation test mode at 80° C. using an advanced rheometric expression system (ARES; ARES-G2 produced by TA Instruments.) to apply 50% of strain to the film. A value of stress σ2 was additionally measured at the time of 180 seconds after the strain-applied film was maintained for 180 seconds, and then Ep according to Equation 1 was calculated.

$$Ep \text{ (unit: \%)} = 100 \times \sigma2/\sigma1 \qquad \text{[Equation 1]}$$

During the measurement, it was careful that there was no bubble when loading the pressure-sensitive adhesive film.

2. Gel Content $$\text{Gel content (wt \%)} = B/A \times 100$$

Here, A is a mass of the pressure-sensitive adhesive, and B is a dry mass of an insoluble content of the pressure-sensitive adhesive remaining after the pressure-sensitive adhesive was dipped in toluene at 60° C. for 24 hours and filtered through a 200-mesh sieve (pore size: 200 μm).

3. Water Vapor Transmission Rate (WVTR)

A resin composition was prepared by dissolving the resin used in Example or Comparative Example in a solvent. The resin composition was applied to a base film (release polyester film) having a thickness of 38 μm. Subsequently, the composition was dried at 110° C. for 10 minutes, thereby forming a film-type pressure-sensitive adhesive layer having a thickness of 100 μm, and then 2 J/cm² of a UV ray was irradiated. Afterward, the base film was peeled, and then a WVTR of the film-type layer was measured in a thickness direction, while a nylon mesh was attached to the film-type pressure-sensitive adhesive layer and the layer was maintained at 100° F. and a relative humidity of 100%. The WVTR was measured according to a specification of ASTM F1249.

4. Evaluation of Reliability (1) A sample was prepared by laminating the film manufactured in Example or Comparative Example on a barrier film (serving as a cover substrate), laminating the resulting product on a glass substrate, and pressure and heat-compressing the resulting product using an autoclave at 50° C. and 5 atm. Afterward, the sample was maintained in a constant temperature and constant humidity chamber at 85° C. and a relative humidity of 85% for approximately 500 hours, and observed whether lifting, bubbles or hazes were generated at an interface between a glass substrate and a pressure-sensitive adhesive layer. When being viewed with the naked eye, at the interface between the glass substrate and the pressure-sensitive adhesive layer, if at least one lifting, bubble or haze was generated, it was represented as X, and if no lifting, bubble or haze was generated, it was represented as O.

(2) A sample was manufactured by the same method, except that a polarizing plate was further laminated on a barrier film in a method of evaluating reliability at 85° C. and a relative humidity of 85%, and observed to check whether lifting or bubbles were generated at an interface between a glass substrate and a pressure-sensitive adhesive while being maintained in a 80° C. chamber for approximately 500 hours. When being viewed with a naked eye, if there was at least one lifting or bubble at the interface between the glass substrate and the pressure-sensitive adhesive layer, it was represented as X, and if there was no lifting or bubble, it was represented as O.

TABLE 1

| | Ep (%) | Gel (%) | WVTR (g/m²·day) | High temperature & high humidity reliability (85° C., 85% RH) | High temperature reliability (80° C., Polarizing plate) |
|---|---|---|---|---|---|
| Example1 | 25 | 51 | 4 | O | O |
| Example2 | 35 | 59 | 4 | O | O |
| Example3 | 45 | 67 | 4 | O | O |
| Example4 | 72 | 80 | 5 | O | O |
| Comparative Example1 | 16 | 0 | 4 | O | X |
| Comparative Example2 | 84 | 85 | 4 | X | X |
| Comparative Example3 | 50 | 80 | >500 | X | O |

What is claimed is:

1. A pressure-sensitive adhesive film, comprising:
   a pressure-sensitive adhesive having an elastic portion (Ep) calculated by Equation 1 of 20 to 80%,
   wherein the pressure-sensitive adhesive film has a water vapor transmission rate in a thickness direction of 50 g/m²·day or less:

Ep (unit: %)=100×σ2/σ1   [Equation 1]

wherein σ1 is the maximum stress value measured when 50% strain is applied to the film by applying 200 gf of normal force with a parallel plate in a relaxation test mode at 80° C. using an advanced rheometric expression system (ARES) while a pressure-sensitive adhesive film is manufactured to have a thickness of 600 μm, and σ2 is a stress value measured after the film is maintained for 180 seconds while the strain is applied to the film.

2. The film according to claim 1, which has a gel content represented by Equation 2 of 50% or more:

Gel content (wt %)=B/A×100   [Equation 2]

wherein A is a weight of the pressure-sensitive adhesive, and B is a dry weight of an insoluble content of the pressure-sensitive adhesive remaining after being dipped in toluene at 60° C. for 24 hours and filtered through a 200-mesh sieve (pore size of 200 μm).

3. The film according to claim 1, wherein the pressure-sensitive adhesive comprises a pressure-sensitive adhesive composition comprising an encapsulating resin and a multifunctional active energy ray-polymerizable compound.

4. The film according to claim 3, wherein the encapsulating resin is a copolymer of a diene and an olefin-based compound having one carbon-carbon double bond.

5. The film according to claim 3, wherein the active energy ray-polymerizable compound is a multifunctional acrylate.

6. The film according to claim 3, wherein the active energy ray-polymerizable compound satisfies Formula 1:

[Formula 1]

wherein $R_1$ is hydrogen or an alkyl group having 1 to 4 carbon atoms, n is an integer of 2 or more, and X is a residue induced from a linear, branched or cyclic alkyl group having 3 to 30 carbon atoms.

7. The film according to claim 3, wherein the active energy ray-polymerizable compound is included at 5 to 30 parts by weight relative to 100 parts by weight of the encapsulating resin.

8. The film according to claim 3, wherein the pressure-sensitive adhesive composition further comprises a silane compound satisfying Formula 2:

[Formula 2]

wherein $R_1$ is hydrogen or an alkyl group, $R_2$ and $R_3$ are each independently hydrogen, or a linear, branched or cyclic alkyl group, or $R_2$ being linked with $R_3$, thereby forming a cyclic alkyl group, $R_4$, $R_5$ and $R_6$ are each independently hydrogen, an alkyl group or an alkoxy group, at least one of $R_4$, $R_5$ and $R_6$ being an alkoxy group, and n is an integer of 1 or more.

9. The film according to claim 8, wherein the silane compound satisfying Formula 2 is included at 0.1 to 10 parts by weight relative to 100 parts by weight of the encapsulating resin.

10. The film according to claim 3, wherein the pressure-sensitive adhesive composition further comprises a tackifier.

11. The film according to claim 10, wherein the tackifier is included at 5 to 100 parts by weight relative to 100 parts by weight of the encapsulating resin.

12. The film according to claim 3, wherein the pressure-sensitive adhesive composition further comprises a radical initiator.

13. The film according to claim 1, wherein the pressure-sensitive adhesive comprises a moisture absorbent.

14. The film according to claim 1, which comprises a first layer having the pressure-sensitive adhesive and a second layer having a pressure-sensitive adhesive resin or an adhesive resin.

15. A product for encapsulating an organic electronic device, comprising:
 a substrate;
 an organic electronic element formed on the substrate; and
 the pressure-sensitive adhesive film according to claim 1 to encapsulate the organic electronic element.

16. A method of manufacturing an organic electronic device, comprising:
 applying the pressure-sensitive adhesive film of claim 1 to a substrate on which an organic electronic element is formed in order to cover the organic electronic element; and curing the pressure-sensitive adhesive film.

* * * * *